(12) United States Patent
Kim

(10) Patent No.: US 10,707,176 B2
(45) Date of Patent: Jul. 7, 2020

(54) METHOD OF MANUFACTURING SEMICONDUCTOR PACKAGE

(71) Applicant: DISCO CORPORATION, Tokyo (JP)

(72) Inventor: Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 42 days.

(21) Appl. No.: 15/988,903

(22) Filed: May 24, 2018

(65) Prior Publication Data

US 2018/0269159 A1 Sep. 20, 2018

Related U.S. Application Data

(62) Division of application No. 15/721,118, filed on Sep. 29, 2017.

(30) Foreign Application Priority Data

Sep. 30, 2016 (JP) .................................. 2016-194250

(51) Int. Cl.
  *B23K 26/402* (2014.01)
  *H01L 23/552* (2006.01)
  (Continued)

(52) U.S. Cl.
  CPC ............ *H01L 23/552* (2013.01); *B23K 26/38* (2013.01); *B23K 26/402* (2013.01);
  (Continued)

(58) Field of Classification Search
  CPC . H01L 23/552; H01L 23/3128; H01L 21/561; H01L 21/568; H01L 21/67092;
  (Continued)

(56) References Cited

U.S. PATENT DOCUMENTS

2009/0075428 A1* 3/2009 Tang ..................... H01L 21/561
  438/114
2015/0303075 A1* 10/2015 Han .................. H01L 23/49805
  438/113
2018/0096948 A1 4/2018 Kim

FOREIGN PATENT DOCUMENTS

JP 2012039104 A 2/2012
JP 2012039164 A 2/2012

OTHER PUBLICATIONS

Office Action dated Jun. 22, 2018 in U.S. Appl. No. 15/721,118, filed Sep. 29, 2017.
Kim, Youngsuk, U.S. Appl. No. 15/845,803, filed Dec. 18, 2017.

* cited by examiner

*Primary Examiner* — Timor Karimy
(74) *Attorney, Agent, or Firm* — Greer Burns & Crain, Ltd.

(57) ABSTRACT

A method of manufacturing a semiconductor package that includes: disposing a semiconductor chip on a support board; sealing the semiconductor chips with a sealant to form a sealed body on the support board, thereby forming sealed semiconductor chips; and forming a rewiring layer and bumps on a side where the semiconductor chip is disposed, after the support board is removed from the sealed body The method also includes an individualizing step of cutting the sealed body along regions corresponding to division lines on the support board, to perform individualization in such a manner that the sealed semiconductor chips each have an upper surface and a lower surface larger than the upper surface, with a side wall inclined from the upper surface toward the lower surface; and a step of forming a conductive shield layer on the upper surfaces and the side walls of the plurality of sealed semiconductor chips.

6 Claims, 16 Drawing Sheets

(51) Int. Cl.
*B23K 26/38* (2014.01)
*H01L 21/56* (2006.01)
*H01L 21/67* (2006.01)
*H01L 21/683* (2006.01)
*H01L 23/31* (2006.01)
*H01L 23/00* (2006.01)
*B23K 101/40* (2006.01)
*H01L 25/00* (2006.01)
*H01L 25/065* (2006.01)

(52) U.S. Cl.
CPC .......... *H01L 21/561* (2013.01); *H01L 21/568* (2013.01); *H01L 21/67092* (2013.01); *H01L 21/6838* (2013.01); *H01L 23/3128* (2013.01); *H01L 24/96* (2013.01); *B23K 2101/40* (2018.08); *H01L 24/16* (2013.01); *H01L 24/48* (2013.01); *H01L 24/75* (2013.01); *H01L 24/78* (2013.01); *H01L 24/81* (2013.01); *H01L 24/85* (2013.01); *H01L 24/97* (2013.01); *H01L 25/0655* (2013.01); *H01L 25/50* (2013.01); *H01L 2224/16225* (2013.01); *H01L 2224/48227* (2013.01); *H01L 2224/7598* (2013.01); *H01L 2224/7898* (2013.01); *H01L 2924/15159* (2013.01); *H01L 2924/15311* (2013.01); *H01L 2924/181* (2013.01); *H01L 2924/1815* (2013.01)

(58) Field of Classification Search
CPC ..... H01L 21/6838; H01L 24/96; H01L 24/97; H01L 25/0655; H01L 24/16; H01L 24/48; H01L 24/75; H01L 24/81; H01L 24/85; H01L 2224/16225; H01L 2224/7898; H01L 25/50; H01L 2924/15159; H01L 2924/15311; H01L 2924/181; H01L 2924/1815; H01L 26/38; B23K 24/78; B23K 26/402; B23K 2101/40
See application file for complete search history.

METHOD OF MANUFACTURING SEMICONDUCTOR PACKAGE

This is a divisional of application Ser. No. 15/721,118, filed on Sep. 29, 2017 under 35 U.S.C. § 111 (a).

BACKGROUND OF THE INVENTION

Field of the Invention

The present invention relates to a method of manufacturing a semiconductor package which has a shielding function.

Description of the Related Art

In general, a semiconductor apparatus used in portable, communication equipment such as a mobile phone is required to restrain leakage of unnecessary electromagnetic waves to the exterior, for preventing bad influences on communication characteristics. Therefore, a semiconductor package should have a shielding function. As a semiconductor package having a shielding function, there has been known one that has a structure wherein a shield layer is provided along an outer surface of a sealing resin layer sealing a semiconductor chip mounted on an interposer substrate (see, for example, Japanese Patent Laid-open No. 2012-039104). The shield provided on the outer surface of the sealing resin layer may be composed of a sheet metal shield, but, in that case, the thickness of the shield is large, which may inhibit the equipment from being made small or thin. In view of this, to reduce the thickness of the shield layer, there have been developed technologies for forming a shield layer by screen printing, spray coating, an ink jet method, sputtering or the like.

SUMMARY OF THE INVENTION

However, since the side surfaces (side walls) of a semiconductor chip sealed with a sealing resin layer are substantially perpendicular, it is difficult to form a shield layer for shielding electromagnetic waves on the upper surface and the side surfaces of the semiconductor chip in such a manner that the film thickness ox the shield layer is as uniform as possible on the upper surface and the side surfaces. In addition, since it is difficult to form the shield layer on the side surfaces (side walls) of the semiconductor chip, as compared to formation of the shield layer on the upper surface, it takes a long time to form the shield layer on the side surfaces in such a film thickness that can exhibit a sufficient shielding effect.

Accordingly, it is an object of the present invention to provide a method of manufacturing a semiconductor package by which a shield layer on side surfaces of a semiconductor chip sealed with a sealing resin layer can be efficiently formed in a predetermined film thickness.

In accordance with an aspect of the present invention, there is provided a method of manufacturing a semiconductor package which is sealed with a sealant, the method including a bonding step of bonding a plurality of semiconductor chips to a plurality of regions on a wiring board partitioned by a plurality of crossing division lines; a sealed board forming step of supplying a sealant to a front surface side of the wiring board to which the plurality of semiconductor chips have been bonded, to seal the plurality of semiconductor chips in a collective manner, thereby forming a sealed board; an individualizing step of cutting the sealed board along regions corresponding to the division lines on the wiring board, to perform individualization in such a manner that the sealed semiconductor chips each have an upper surface and a lower surface larger than the upper surface, with a side wall inclined from the upper surface toward the lower surface; and a shield layer forming step of forming a conductive shield layer on the upper surfaces and the side walls of the plurality of sealed semiconductor chips.

In accordance with another aspect of the present invention, there is provided a method of manufacturing a semiconductor package which is sealed with a sealant, the method including: a chip disposing step of disposing a semiconductor chip in each of device disposing regions on a support board partitioned by a plurality of crossing division lines; a sealed body forming step of sealing the semiconductor chips with a sealant to form a sealed body on the support board, after performing the chip disposing step; a rewiring step of forming a rewiring layer and bumps on the semiconductor chip side of the sealed body, after the support board is removed from the sealed body; an individualizing step of cutting the sealed body along regions corresponding to the division lines on the support board, to perform individualization in such a manner that the sealed semiconductor chips each have an upper surface and a lower surface larger than the upper surface, with a side wall inclined from the upper surface toward the lower surface; and a shield layer forming step of forming a conductive shield layer on the upper surfaces and the side walls of the plurality of sealed semiconductor chips.

According to the above configurations, the method of manufacturing a semiconductor package includes the individualizing step of performing individualization in such a manner that the sealed semiconductor chips each have an upper surface and a lower surface larger than the upper surface, with a side wall inclined from the upper surface toward the lower surface. Therefore, the shield layer can be easily formed on the inclined side wall, and the shield layer on the side wall of the semiconductor chip sealed with the sealing resin layer can be efficiently formed into a predetermined film thickness.

Preferably, in the individualizing step, a cutting blade having an annular cutting edge is made to cut into the sealed board or the sealed body while rotating, thereby to perform individualization.

Preferably, in the individualizing step, a laser beam is applied to the sealed board or the sealed body while inclining the laser beam at a predetermined angle in a direction orthogonal to a processing feed direction in relation to a direction perpendicular to a laser beam application surface of the sealed board or the sealed body, thereby to perform individualization.

According to the present invention, the method of manufacturing a semiconductor package includes the individualizing step of performing individualization in such a manner that the sealed semiconductor chips each have an upper surface and a lower surface larger than the upper surface, with a side wall inclined from the upper surface toward the lower surface. Therefore, the shield layer can be easily formed on the inclined side wall, and the shield layer on the side wall of the semiconductor chip sealed with the sealing resin layer can be efficiently formed in a predetermined film thickness.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
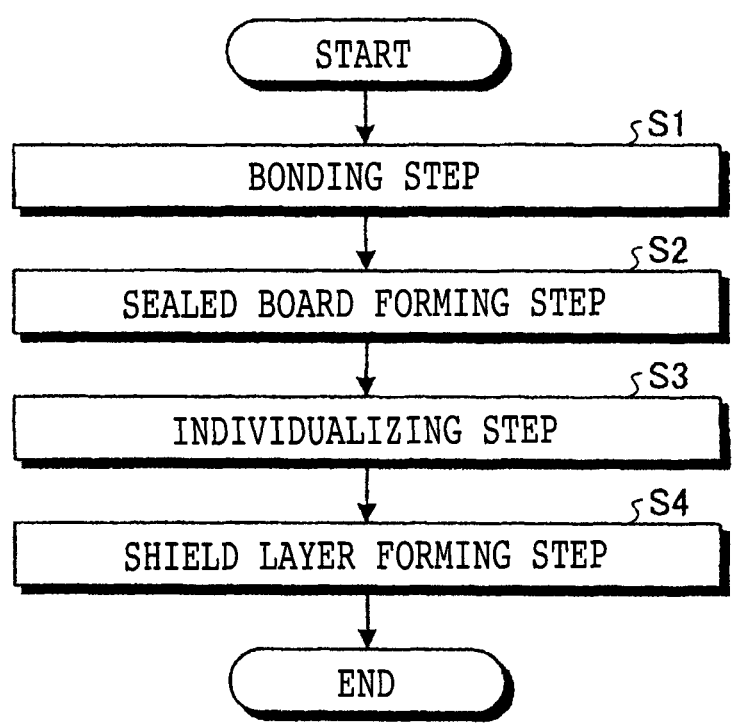
FIG. 1 is a flow chart illustrating a procedure of a method of manufacturing a semiconductor package according to a first embodiment of the present invention.

Embodiments of the present invention will be described in detail below, referring to the drawings. The present invention is not limited to or by the contents of the following embodiments. In addition, the constituent elements to be described below include those which can be easily thought by one skilled in the art and substantial equivalents of them.

Further, the configurations to be described below may be combined appropriately. Besides, various omissions, substitutions and modifications are possible without departing from the gist of the present invention.

First Embodiment

FIG. 1 is a flow chart illustrating a procedure of a method of manufacturing a semiconductor package according to a first embodiment. While details will be described later, the semiconductor package is a package type semiconductor apparatus (e.g., chip scale package (CSP) or ball grid array (BGA)) provided with a resin layer for sealing a semiconductor chip, and a conductive shield layer covering an outer surface of the resin layer. In this embodiment, the method of manufacturing a semiconductor package includes a bonding step S1, a sealed board forming step S2, an individualizing step S3, and a shield layer forming step S4f as illustrated in FIG. 1. It is sufficient that the manufacturing method in this embodiment includes at least these steps, and other steps may be provided between these steps. Each of the steps will be described below.

Bonding Step S1

Figure 2:
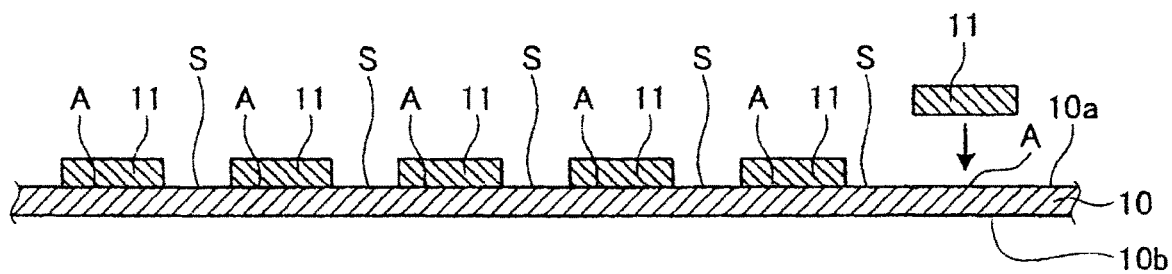
FIG. 2 is a sectional view illustrating a state in which semiconductor chips are bonded to a wiring board.

FIG. 2 is a side sectional view illustrating a state in which, semiconductor chips are bonded to a wiring board. In the bonding step S1, semiconductor chips 11 are mounted, by bonding, on a front surface (one side) 10a of a wiring board 10. The wiring board 10 has a plurality of mounting regions (regions) A partitioned by a plurality of crossing streets (division lines) S, the mounting regions A being formed in a matrix pattern. Though not illustrated, electrodes to be connected to terminals of the semiconductor chip 11 and wiring inclusive of a ground line are provided in each of the mounting regions A. The semiconductor chips 11 are so-called dies formed by dividing a wafer wherein semiconductor devices are provided on a substrate formed of, for example, silicon, sapphire, or gallium.

These semiconductor chips 11 are mounted, by bonding, in the mounting regions A formed on the front surface 10a of the wiring board 10. Specifically, there may be adopted a mounting form of a flip chip type wherein terminals formed on a lower surface of the semiconductor chip 11 and electrodes formed in the mounting region A are connected directly, or a mounting form of a wire bonding type wherein terminals formed on an upper surface of the semiconductor chip 11 and electrodes formed in the mounting region A are connected through wires.

In the bonding step S1, the wiring board 10 is placed on a jig (not illustrated), with a back surface (the other side) 10b side of the wiring board 10 directed down. The jig has, for example, a suction mechanism, and holds the wiring board 10.

Sealed Board Forming Step S2

Figure 3:
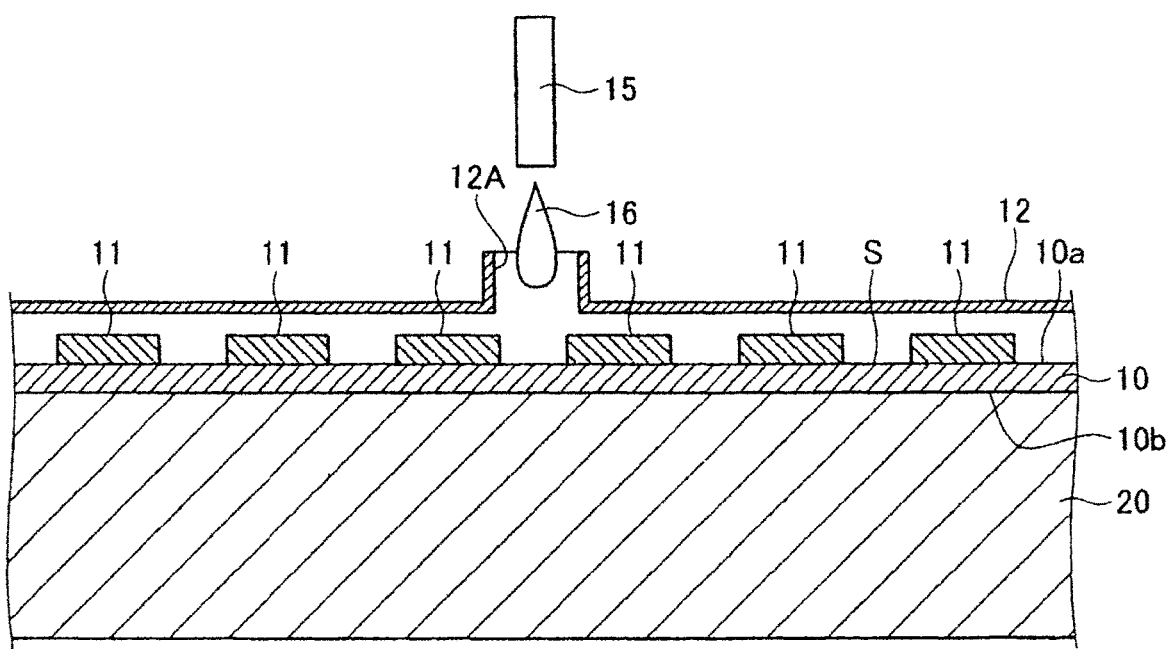
FIG. 3 is a sectional view illustrating a configuration for supplying a liquid resin for sealing to a wiring board on which semiconductor chips have been mounted.
Figure 4:
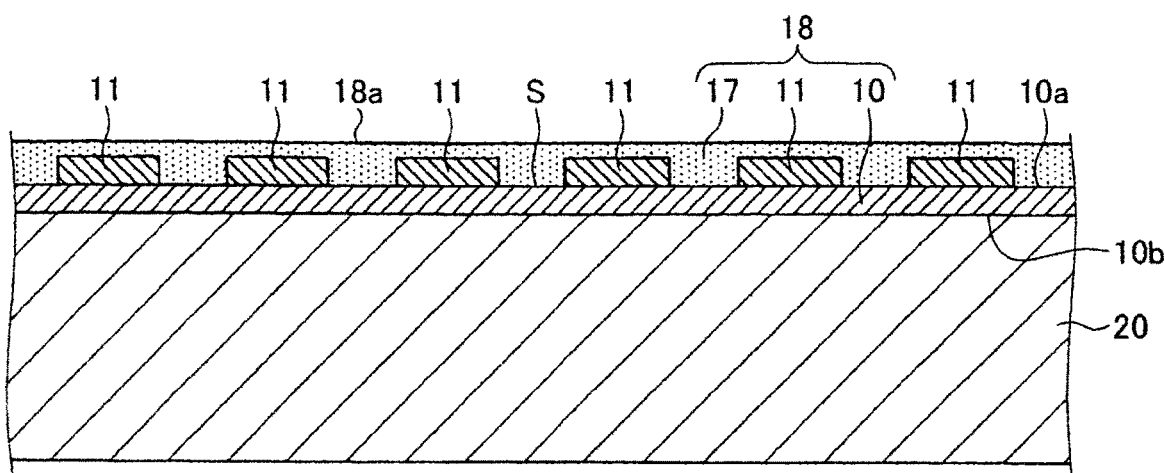
FIG. 4 is a sectional view of a sealed board sealed with a resin.

FIG. 3 illustrates a configuration for supplying a liquid resin for sealing to the wiring board on which the semiconductor chips are mounted, and FIG. 4 is a side sectional view of the sealed board sealed with the resin. In the sealed board forming step S2, the semiconductor chips 11 mounted in the mounting regions A formed on the wiring board 10 are sealed. In this embodiment, as illustrated in FIG. 3, the wiring board 10 with the semiconductor chips 11 mounted thereon is held, on a sealing jig 20, and a mold 12 is disposed on the upper side of the wiring board 10. The mold 12 is provided with a pouring port 12A at an upper surface thereof, and a resin supply nozzle 15 is disposed on the upper side of the pouring port 12A. A liquid resin (molding resin) 16 supplied from the resin supply nozzle 15 is poured through the pouring port 12A, to fill up a gap between the wiring board 10 and the mold 12. As the liquid resin 16, a curable one is used, which can be selected from among, for example, epoxy resins, silicone resins, urethane resins, unsaturated polyester resins, acryl-urethane resins, and polyimide resins. By the liquid resin 16 filling the mold 12, the plurality of semiconductor chips 11 mounted on the wiring hoard 10 can be sealed collectively.

Next, the liquid resin 16 sealing the semiconductor chips 11 is cured by heating or drying. This results in that the liquid resin 16 is cured to form a sealing resin layer 17, as illustrated in FIG. 4. The sealing resin layer 17 makes close contact with the wiring board 10 and the semiconductor chips 11 mounted on the wiring board 10, and is united with the wiring board 10 and the semi-conductor chips 11 to form a sealed board 18.

Here, it is preferable to flatten, by grinding, the front surface 18a of the sealed board 18 (the sealing resin layer 17) (flattening step). Since the sealing resin layer 17 is a layer formed by supplying the liquid resin 16 to the front surface 10a of the wiring board 10 and then curing the liquid resin 16 as aforementioned, the front surface 18a of the sealed board 18 (the sealing resin layer 17) is rugged (is formed with projections and recesses). Therefore, it is favorable to flatten the front surface 18a of the sealed board 18 by grinding the sealed board 18 by a grinding unit which is not illustrated. In this case, it is possible not only to simply flatten the front surface 18a but also to control the sealing resin layer 17 covering the upper surface of the semiconductor chip 11 to a desired thickness.

Figure 5:
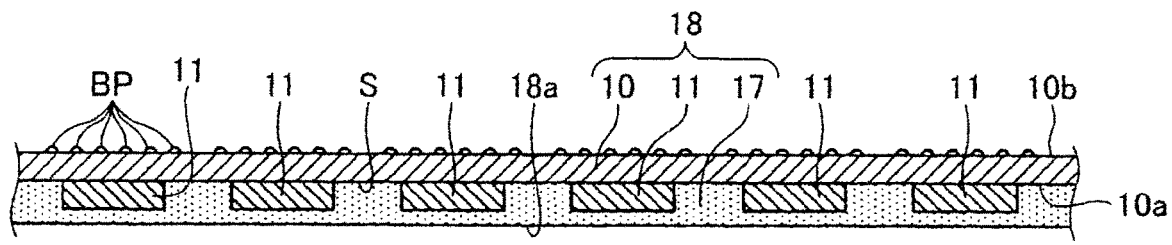
FIG. 5 is a sectional view of a sealed board wherein bumps are formed on a back surface of a wiring board.

Next, bumps BP are formed on the back surface 10b of the wiring board 10 (bump forming step). FIG. 5 is a side sectional view of a sealed board wherein bumps are formed on a back surface of a wiring board. In the case of forming the bumps BP, the sealed board 18 is held on a jig (not illustrated), with the front surface 18a of the sealed board 18 as a lower surface. This results in that the back surface 10b of the wiring board 10 constitutes an upper surface and is exposed, as illustrated in FIG. 5. In this condition, the bumps BP are formed on the back surface 10b of the wiring board 10. The bumps BP are members which are to be terminals or electrodes when a semiconductor package as a final form is mounted to one of various substrates (not illustrated), and are formed in predetermined positions according to wiring patterns formed on the wiring board 10. Note that while the bump forming step is performed after the sealed board forming step S2 in this embodiment, the bumps BP may preliminarily be formed on the back surface 10b of the wiring board 10 in the case where the positions in which to form the bumps BP are preliminarily known.

Individualizing Step S3

Figure 6:
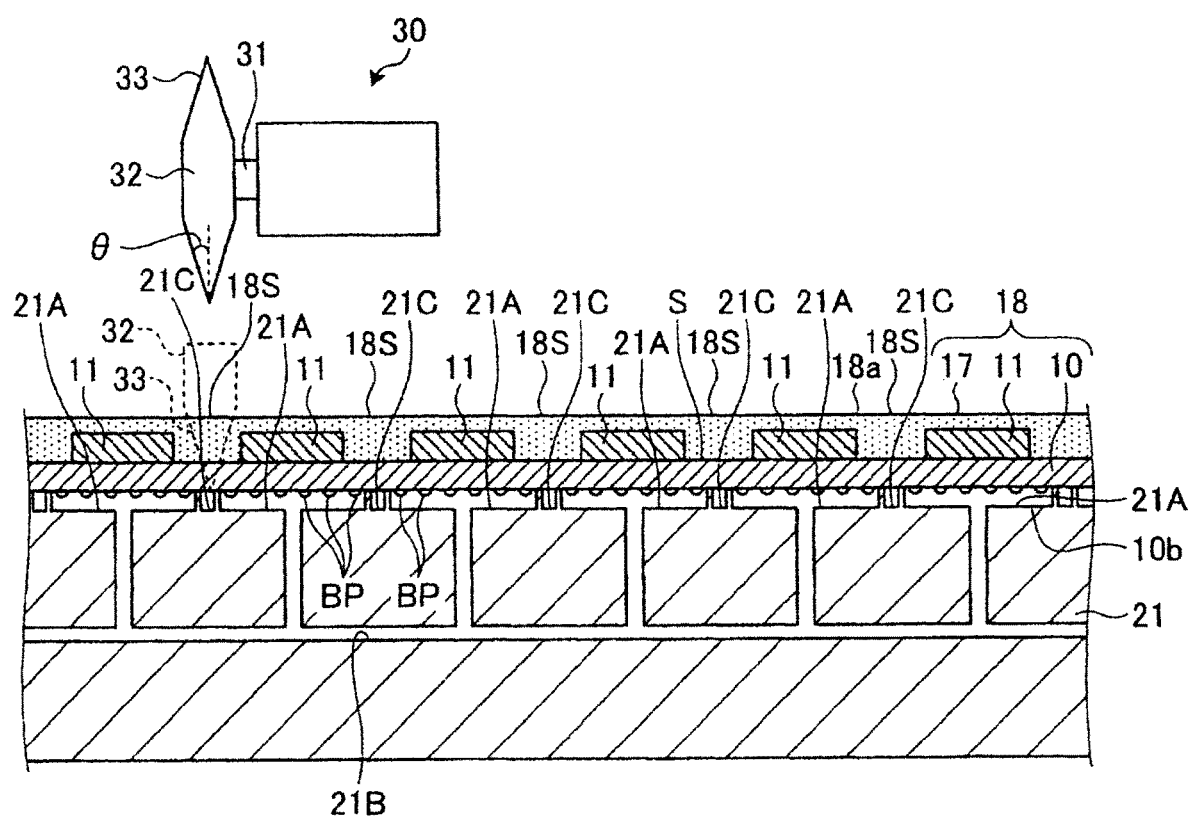
FIG. 6 is a sectional view illustrating an example of a configuration for individualizing a sealed board by cutting.
Figure 7:
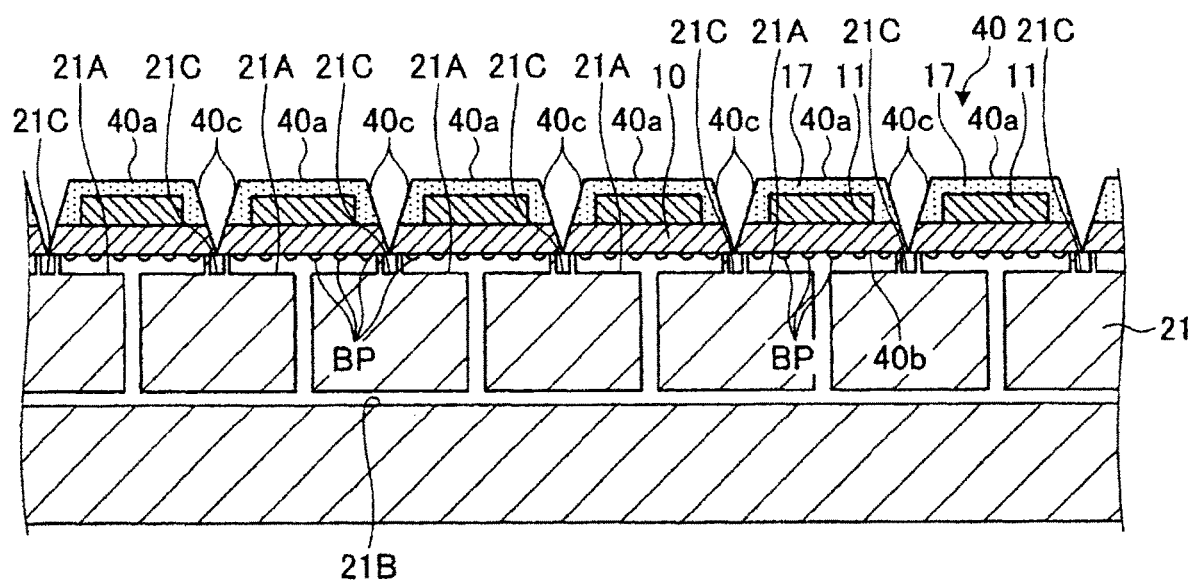
FIG. 7 is a sectional view illustrating sealed chips individualized by cutting.

FIG. 6 is a side sectional view illustrating an example of a configuration for individualizing a sealed board by cutting, and FIG. 7 is a side sectional view illustrating sealed chips individualized by cutting. As illustrated in FIG. 6, the wiring board 10 is held on an individualizing jig 21, with its back surface 10b formed with the bumps BP as a lower surface. The individualizing jig 21 is formed in its upper surface with a plurality of holes 21A in a matrix pattern, and the bumps BP corresponding to each semiconductor chip 11 are accommodated in each of the holes 21A. In addition, each hole 21b is connected with a suction passage 21B communicating with a suction source (not illustrated), and the wiring board 10 is held by suction. Besides, the individualizing jig 21 is formed with cutting grooves 21C each located between the holes 21A. The cutting grooves 21C are formed to correspond to the streets S of the wiring board 10 when the wiring board 10 is held on the individualizing jig 21.

Next, the sealed board 18 is cut along regions 18S corresponding to the above-mentioned streets S. In this embodiment, as illustrated in FIG. 6, the cutting of the sealed board 18 is conducted by use of a cutting unit 30. The cutting unit 30 includes a cutting blade 32 mounted to a rotating spindle 31. The cutting blade 32 is formed in a circular disk shape, and is provided at its peripheral edge with a cutting edge 33 which is formed in an annular shape. As illustrated in FIG. 6, the cutting edge 33 is a V-shaped cutting edge having a predetermined cutting edge angle θ relative to a vertical line. In addition, the cutting unit 30 is moved in the height direction, in such a manner that the cutting blade 32 can be advanced and retracted relative to the sealed board 18, by a lift mechanism which is not illustrated. Therefore, where the cutting blade 32 is made to cut into the sealed board 18 while rotating, the sealed board 18 is thereby cut at an inclination angle according to the cutting edge angle θ. In addition, since the individualizing jig 21 is formed with the cutting grooves 21C corresponding to the streets S of the wiring board 10, the cutting edge tip of the cutting edge 33 having cut, the sealed board 18 comes into the cutting groove 21C, whereby interference between the individualizing jig 21 and the cutting blade 32 (the cutting edge 33) can be prevented from occurring.

Besides, the sealed board 18 held on the individualizing jig 21 is moved in a horizontal direction relative to the cutting unit 30 by a moving mechanism which is not illustrated. By this, it is ensured that the sealed board 18 is cut along the regions 18S corresponding to all the streets S, whereby the sealed board 18 is individualized into a plurality of sealed chips 40, as illustrated in FIG. 7. The sealed chips 40 each have an upper surface 40a, a lower surface 40b larger than the upper surface 40a, and side surfaces (side walls) 40c inclined from the upper surface 40a to the lower surface 40b. Note that the above-mentioned lift mechanism and moving mechanism may have any configuration so long as the cutting unit 30 and the individualizing jig 21 can be thereby lifted and moved relative to each other.

Figure 8:
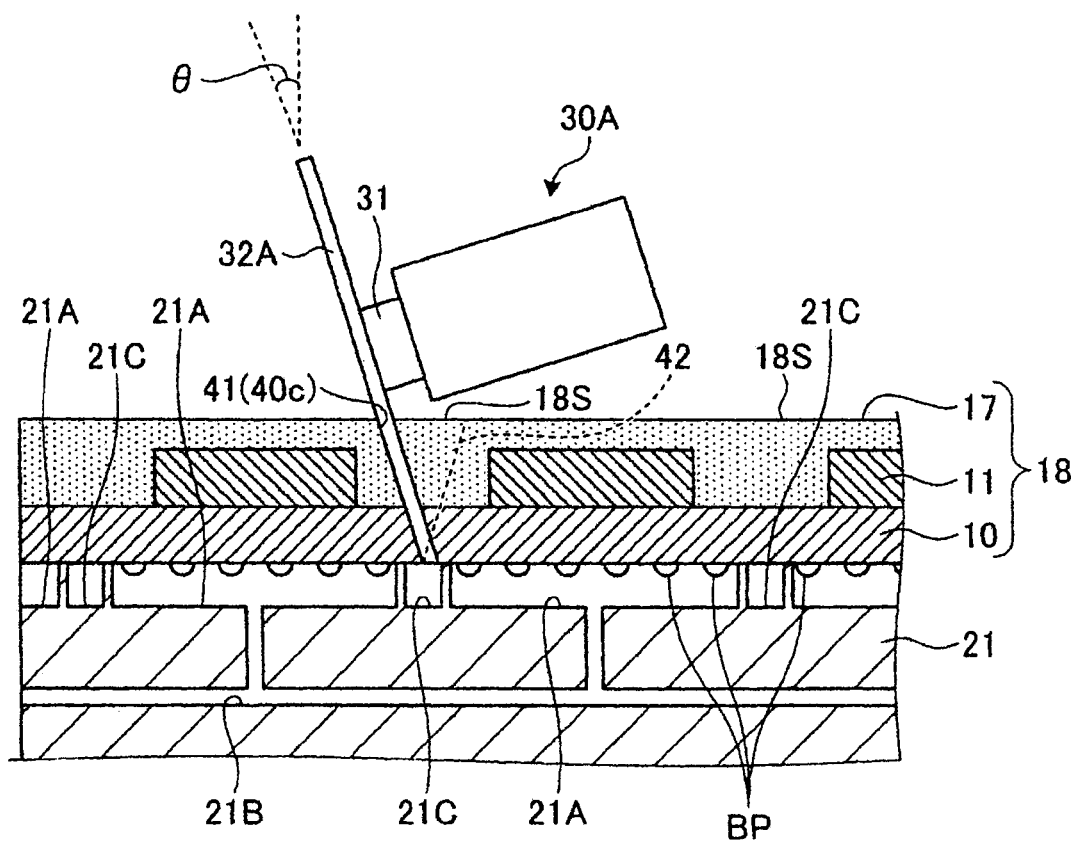
FIG. 8 is a sectional view illustrating another example of the configuration for individualizing a sealed board by cutting.
Figure 9:
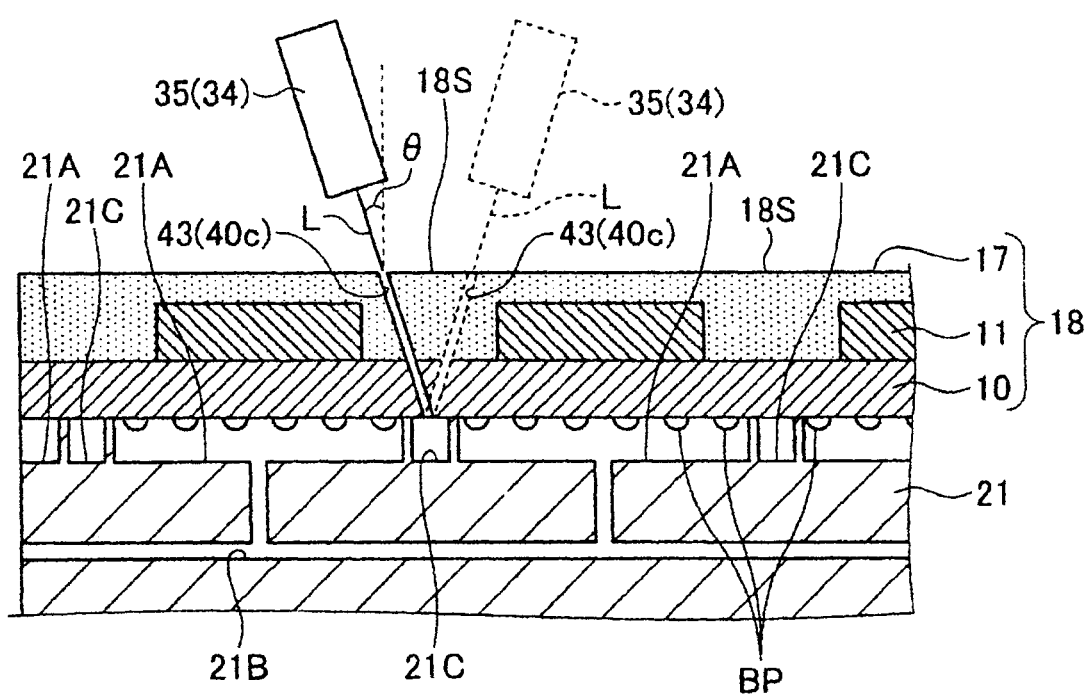
FIG. 9 is a sectional view illustrating a further example of the configuration for individualizing a sealed, board by cutting.

In addition, the individualization of the sealed board 18 by cutting may be carried out by other configurations. FIGS. 8 and 9 are side sectional views illustrating other examples of the configuration for individualizing the sealed board by cutting. In the example of FIG. 8, a cutting unit 30A is disposed with a cutting blade 32A inclined by a predetermined angle θ relative to a vertical line. Therefore, even in a configuration wherein the cutting blade 32A used for forming ordinary cut grooves is used, it is possible, by cutting along predetermined cutting lines 42, to form the sealed board 18 with inclined grooves 41 inclined at the predetermined angle θ. Side surfaces of the inclined grooves 41 define the side surfaces 40c of the sealed chips 40 mentioned above.

Besides, in the example of FIG. 9, individualization is conducted by laser processing using a laser beam application apparatus 34. The laser beam application apparatus 34 applies a laser beam L toward the regions 18S corresponding to the streets S of the sealed board 18, to perform cutting by ablation. The laser beam application apparatus 34 includes an oscillator (not illustrated) for oscillating the laser beam 1, and a focusing unit 35 for focusing the laser beam L oscillated by the oscillator. The focusing unit 35 includes a total reflection mirror for changing the propagating direction of the laser beam L oscillated by the oscillator, a condenser lens for condensing the laser beam L, and the like. The focusing unit 35 is disposed in the state of being inclined at a predetermined angle θ in a direction orthogonal to the extending direction of the street S (processing feed direction) in relation to a direction perpendicular to the front surface (laser beam application surface) 18a of the sealed board 18: (vertical direction) and emits the laser beam L inclined at the predetermined angle θ. By this, the sealed board 18 can be formed with inclined grooves 43 inclined at the predetermined angle θ. Side surfaces of the inclined grooves 43 define the side surfaces 40c of the sealed chips 40 mentioned above. In addition, though omitted in the drawing, a configuration may be adopted wherein the sealed board 18 is cut (diced) perpendicularly (vertically) along the streets S by use of the cutting unit or the laser beam application apparatus, and thereafter the side surfaces of the sealed chips thus separated are subjected to inclined-surface processing by a profiler or the like.

Figure 10:
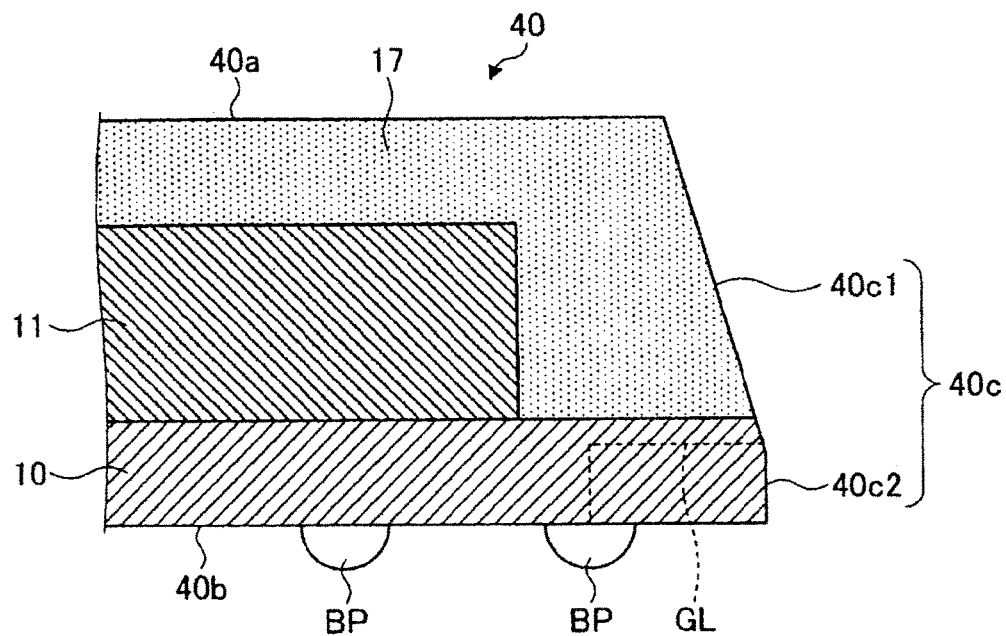
FIG. 10 is a partial sectional view illustrating a modification of cutting a sealed board.

While a configuration wherein the side surfaces 40c of the sealed chip 40 are uniformly inclined from the upper surface 40a toward the lower surface 40b has been adopted in the above example, this configuration is not limitative. FIG. 10 is a partial side sectional view illustrating a modification in cutting the sealed board. A configuration may be adopted wherein as illustrated in FIG. 10, the side surface 40c of the sealed chip 40 includes a first side surface 40c1 extending inclinedly from the upper surface 40a toward the lower surface 40b, and a second side surface 40c2 extending vertically from the first side surface 40c1 toward the lower surface 40b. In this configuration, since the second side surface 40c2 is provided, the size of the lower surface 40b of the sealed chip 40 can be reduced accordingly, and a reduction in size of the sealed chip 40 can be achieved accordingly. In the case of this configuration, individualization can be performed by a method wherein, for example, by use of the cutting edge 33 formed in a V shape, the sealing resin layer 17 (see FIG. 6) of the sealed board 18 is cut from the upper surface 40a side to form the first side surface 40c1, and thereafter the wiring board 10 is vertically cut from the upper surface 40a side or the lower surface 40b side to form the second side surface 40c2. Besides, individualization may be conducted by a method wherein, for example, in forming the bumps BP on the back surface 10b of the wiring board 10 in the bump forming step, the wiring board 10 is vertically cut from the back surface 10b side of the wiring board 10 to form the second side surface 40c2 preliminarily, and, in the individualizing step, for example by use of the V-shaped cutting edge 33 or the like, the sealing resin layer 17 (see FIG. 6) of the sealed board 18 is cut from the upper surface 40a side to form the first side surface 40c1. In this case, as depicted in FIG. 10, the first side surface 40c1 is provided to such a position as to reach a ground line GL provided in the wiring board 10. According to this configuration, electromagnetic waves shielded by a conductive shield layer (not illustrated) provided on the first side surface 40c1 can be securely let flow to the exterior through the ground line GL.

Shield Layer Forming Step S4

Figure 11:
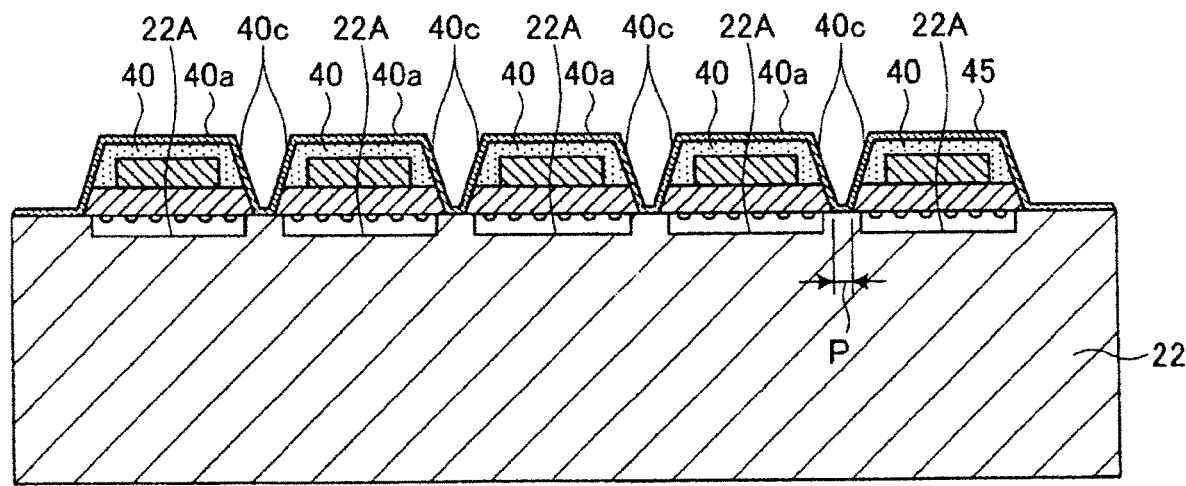
FIG. 11 is a sectional view illustrating sealed chips formed with a conductive shield layer.

FIG. 11 is a side sectional view illustrating a sealed chip formed with a conductive shield layer. First, before formation of a conductive shield layer 45, the individualized sealed chips 40 are picked up from the individualizing jig 21 holding the sealed chips 40 thereon, and the sealed chips 40 thus picked up are alignedly disposed on another jig 22 for covering. The covering jig 22 is formed in its upper surface with a plurality of holes 22A in a matrix pattern, like the individualizing jig 21, and the bumps BP of each sealed chip 40 are accommodated in each of the holes 22A. On the covering jig 22, the sealed chips 40 are disposed at a predetermined interval P between the adjacent sealed chips 40. The interval P has a sufficient distance for the conductive shield layer 45 to be formed to range to the lower ends of the side surfaces 40c of the sealed chip 40. Note that though omitted in FIG. 11, the covering jig 22 may be provided with a suction passage, in communication with each of the holes 22b, for holding each of the sealed chips 40 by suction.

Next, the conductive shield layer 45 is formed on the upper surfaces 40a and the side surfaces 40c of the sealed chips 40. The conductive shield layer 45 is a multilayer film formed of at least one metal selected from among copper, titanium, nickel, gold and the like in a thickness of approximately several micrometers to several hundreds: of micrometers by, for example, sputtering, chemical vapor deposition (CVD), or spray coating. In addition, the conductive shield layer 45 may be formed by vacuum lamination wherein a metallic film composed of the above-mentioned multilayer film is adhered (laminated) onto the upper surfaces 40a and the side surfaces 40c of the sealed chips 40 by use of a conductive adhesive in a vacuum atmosphere. In this embodiment, since the side surfaces 40c of the sealed chips 40 are inclined surfaces which are each inclined from the upper surface 40a toward the lower surface 40b, it is ensured that in the case of forming the conductive shield layer 45 by sputtering or the like from above the sealed chips 40, the metallic film can be easily formed not only on the upper surfaces 40a but also on the side surfaces 40c. Therefore, it is possible to make uniform the film thickness ox the conductive shield layer 45 on the upper surfaces 40a and the side surfaces 40c of the sealed chips 40.

Finally, the sealed chips 40 thus formed with the conductive shield layer 45, or semiconductor packages 50, are picked up from the covering jig 22 by a pick-up unit, and are carried to the subsequent step.

Figure 12:
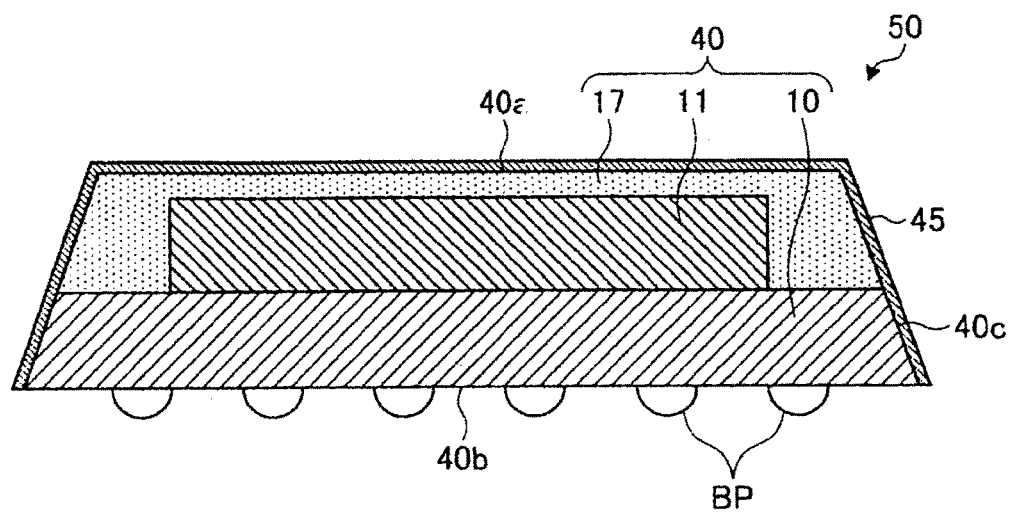
FIG. 12 is a sectional view illustrating a configuration of a semiconductor package.
Figure 13:
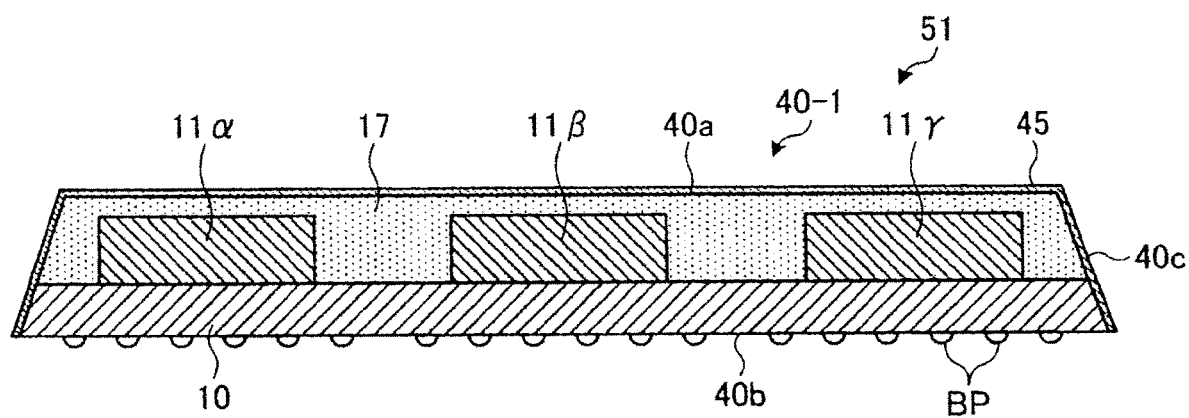
FIG. 13 is a sectional view illustrating a modification of the semiconductor package.
Figure 14:
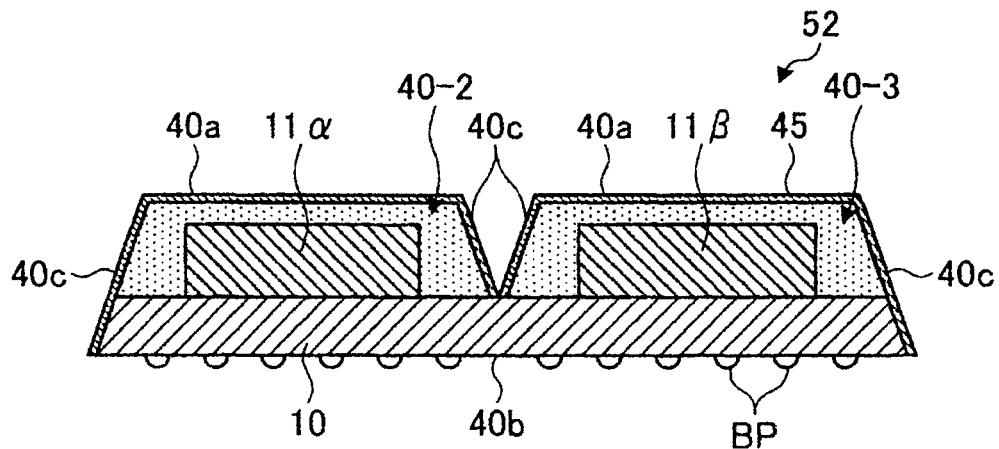
FIG. 14 is a sectional view illustrating another modification of the semiconductor package.

FIG. 12 is a side sectional view illustrating a configuration of a semiconductor package, and FIGS. 13 and 14 are side sectional views illustrating modifications of the semiconductor package. As illustrated in FIG. 12, the semiconductor package 50 includes the sealed chip 40 including the semiconductor chip 11 mounted on the wiring board 10 and the sealing resin layer 17 formed by sealing the semiconductor chips 11 with a resin, and the conductive shield layer 45 formed on the upper surface 40a and side surfaces 40c of the sealed chip 40. In this embodiment, since the side surfaces 40c of the sealed chip 40 are inclined surfaces each inclined from the upper surface 40a toward the lower surface 40b, the metallic film can easily be formed on not only the upper surface 40a but also the side surfaces 40c of the sealed chip 40, so that it is possible to make uniform the film thickness of the conductive shield layer 45 on the upper surface 40a and the side surfaces 40c of the sealed chip 40.

While a configuration wherein the semiconductor package 50 has the sealed chip 40 having one semiconductor chip 11 mounted on the wiring board 10 has been described in this embodiment, this configuration is not restrictive. It is possible, as illustrated in FIG. 13, to manufacture a semiconductor package 51 provided with a sealed chip 40-1 formed by mounting, for example, a plurality (three) of semiconductor chips 11α, 11β, and 11γ on a wiring board 10, and sealing the semiconductor chips 11α, 11β, and 11γ with a sealing resin layer 17. In this configuration, the semiconductor chips 11α, 11β, and 11γ are semiconductor chips having different functions, and are adjacently mounted in the bonding step S1. In addition, individualization into the sealed chip 40-1 including the semiconductor chips 11α, 11β, and 11γ is conducted in the individualizing step S3. Even in the semiconductor package 51 provided with this kind of semiconductor chip 40-1, the side surfaces 40c of the sealed chip 40-1 are inclined surfaces each inclined from the upper surface 40a toward the lower surface 40b, so that a metallic film can easily be formed on not only the upper surface 40a but also the side surfaces 40c of the sealed chip 40-1, and it is possible to make uniform the film thickness of the conductive shield layer 45 on the upper surface 40a and the side surfaces 40c of the sealed chip 40-1.

In addition, as illustrated in FIG. 14, it is possible to manufacture a semiconductor package (SIP) 52 provided with semiconductor chips 40-2 and 40-3 obtained by mounting a plurality (two) of semiconductor chips 11α and 11β on a wiring board 10, and sealing the semiconductor chips 11α and 11β respectively with a sealing resin layer 17. In this configuration, the semiconductor chips 11α and 11β are semiconductor chips having different functions, and are adjacently mounted in the bonding step S1. Besides, individualization into an integrated sealed chip including the semiconductor chips 11α and 11β is conducted in the individualizing step S3. In the individualizing step S3, the sealed chip is divided between the semiconductor chips 11α and 11β into two sealed chips 40-2 and 40-3, and their side surfaces 40c are formed as inclined surfaces each inclined from the upper surface 40a toward the lower surface 40b. According to this configuration, a metallic film can easily be formed on not only the upper surface 40a but also the side surfaces 40c of each of the sealed chips 40-2 and 40-3, and it is possible to make uniform the film thickness of the conductive shield layer 45 on the upper surfaces 40a and the side surfaces 40c of the sealed chips 40-2 and 40-3. In addition, the conductive shield layers 45 for shielding between the sealed chips 40-2 and 40-3 can be easily formed.

According to this embodiment, the method of manufacturing a semiconductor package includes: the bonding step S1 of bonding the plurality of semiconductor chips 11 to the plurality of mounting regions A on the wiring board 10 partitioned by the crossing streets S; the sealed board forming step S2 of supplying the liquid resin 16 to the front surface 10a side of the wiring board 10 having the plurality of semiconductor chips 11 bonded thereto, to seal the plurality of semiconductor chips 11 collectively, thereby forming the sealed board 18; the individualizing step S3 of cutting the sealed board 18 along the regions 18S corresponding to the streets S on the sealed board 18, to perform individualization such that the sealed chips 40 each have the upper surface 40a and the lower surface 40b larger than the upper surface 40a, with the side surfaces 40c each inclined from the upper surface 40a toward the lower surface 40b; and the shield layer forming step S4 of forming the conductive shield layer 45 on the upper surfaces 40a and the side surfaces 40c of the plurality of sealed chips 40. Therefore, in the case of forming the conductive shield layer 45, a metallic film can be easily formed not only on the upper surfaces 40a but also on the side surfaces 40c. Consequently, the conductive shield layer 45 on the side surfaces 40c of the sealed chips 40 can effectively be formed in a predetermined film thickness which enables a sufficient shielding effect to be displayed, and it is possible to make uniform the film thickness of the conductive shield layer 45 on the upper surfaces 40a and the side surfaces 40c of the sealed chips 40.

Besides, in this embodiment, in the individualizing step S3, the cutting blade 32 having the annular cutting edge 33 is made to cut into the sealed board 18 while rotating, to perform individualization, so that the sealed board 18 can be easily individualized. In this case, by setting the cutting blade 32 to have the V-shaped cutting edge 33 with a cutting edge angle θ, or by disposing the cutting blade 32A to be inclined at a predetermined angle θ relative to a vertical line, it is possible, in performing individualization, to easily form the side surfaces 40c of the sealed chips 40 as inclined surfaces each inclined from the upper surface 40a toward the lower surface 40b.

In addition, in another example of this embodiment, the focusing unit 35 of the laser beam application apparatus 34 is disposed to be inclined at a predetermined angle θ in the direction orthogonal to the extending direction of the street S (processing feed direction) in relation to the direction perpendicular to the front surface 18a of the sealed board 18. Therefore, it is possible, in performing individualization by laser processing, to easily form the side surfaces 40c of the sealed chips 40 as inclined surfaces each inclined from the upper surface 40a toward the lower surface 40b.

Second Embodiment

Figure 15:
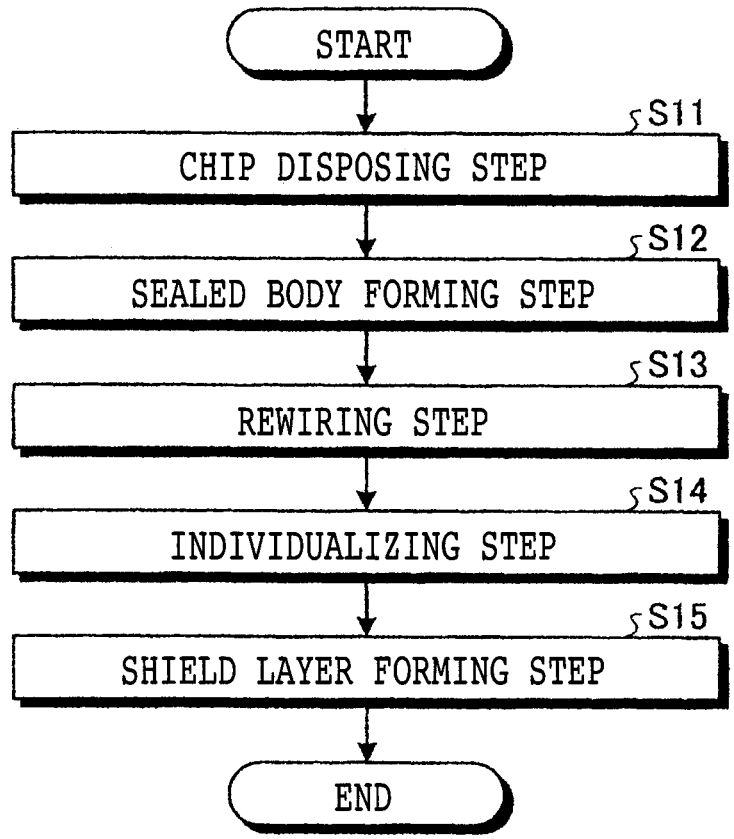
FIG. 15 is a flow chart illustrating a procedure of a method of manufacturing a semiconductor package according to a second embodiment of the present invention.

FIG. 15 is a flow chart illustrating a procedure of a method of manufacturing a semiconductor package according to a second embodiment. The semiconductor package formed by the manufacturing method of the second embodiment is a package type semiconductor apparatus (e.g., fan-out wafer level package (FO-WLP) or the like) including a resin layer for sealing a semiconductor chip, and a conductive shield layer covering an outer surface of the resin layer. In this embodiment, as illustrated in FIG. 15, the method of manufacturing the semiconductor package includes a chip disposing step S11, a sealed body forming step S12, a rewiring step S13, an individualizing step S14, and a shield layer forming step S15. It is sufficient that the manufacturing method in this embodiment has these steps, and other steps may be provided between the steps. Each of these steps will be described below.

Chip Disposing Step S11

Figure 16:
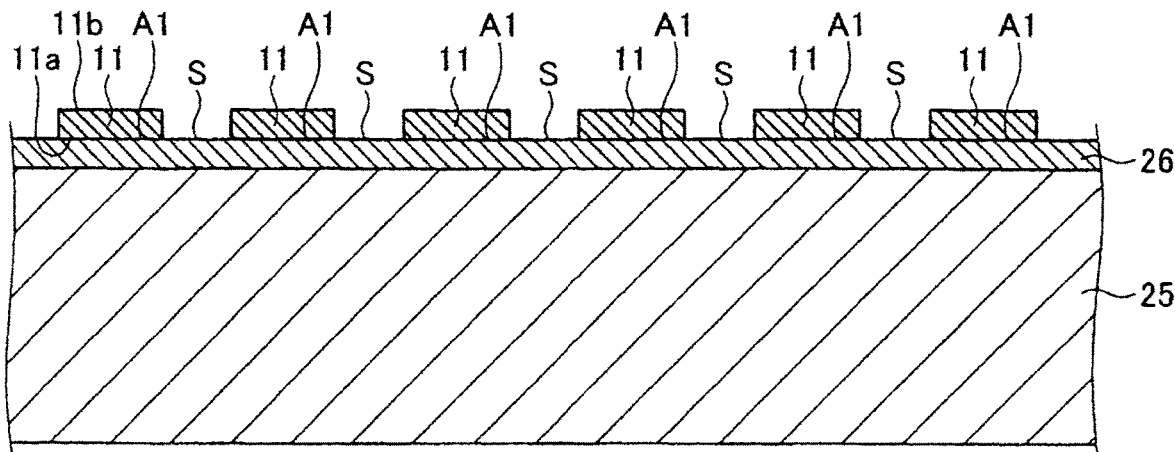
FIG. 16 is a sectional view illustrating a state in which semiconductor chips are disposed on a support board.

FIG. 16 is a side sectional view illustrating a state in which semiconductor chips are disposed on a support board. The support board 25 is for holding a plurality of semiconductor chips 11 disposed on the support board 25, and is formed of a rigid material (e.g., glass) having a certain extent of rigidity. On the support board 25, a plurality of device disposing regions A1 partitioned by a plurality of crossing streets S are set in a matrix pattern. The positions and sizes of the streets S and the device disposing regions A1 are determined according to the semiconductor package to be formed.

The semiconductor chips 11 are so-called dies formed by dividing a wafer provided with semiconductor devices on a substrate formed of, for example, silicon, sapphire, gallium or the like. In this embodiment, various terminals are formed on a front surface (one side) 11a of the semiconductor chip 11, and the semiconductor chip 11 is disposed in the device disposing region hi on the support board 25, with the front surface (one side) 11a on the lower side. The semiconductor chip 11 is fixed on the support board 25 through a protective tape 26 having a pressure sensitive adhesive force which is lowered by irradiation of ultraviolet (UV) rays of a predetermined wavelength (300 to 400 nm), for example.

Sealed Body Forming Step S12

Figure 17:
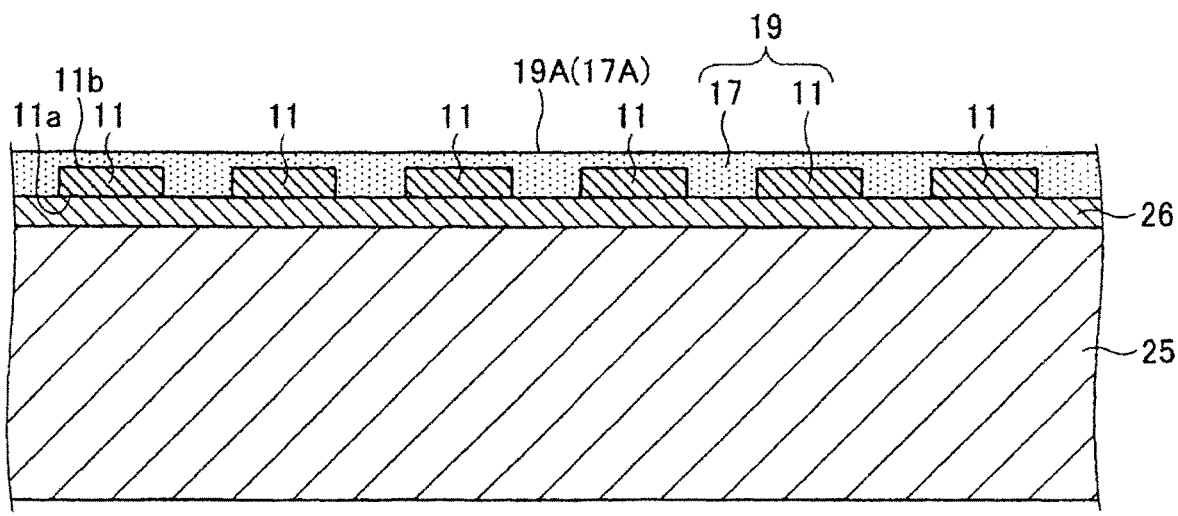
FIG. 17 is a sectional view of a sealed body sealed with a resin.

FIG. 17 is a side sectional view of a sealed body sealed with a resin. In the sealed body forming step S12, the semiconductor chips 11 disposed in the device disposing regions A1 set on the support board 25 are sealed. For example, a mold (not illustrated) is disposed on the upper side of the support board 25 with the semiconductor chips 11 disposed thereon, and a liquid resin 16 (see FIG. 3; sealant) is supplied through a pouring port of the mold to fill up a gap between the support board 25 (protective tape 26) and the mold.

Next, the liquid resin 16 sealing the semiconductor chips 11 is cured by heating or drying. This results in that the liquid resin is cured to form a sealing resin layer 17, as illustrated in FIG. 17. The sealing resin layer 17 makes close contact with the plurality of semiconductor chips 11 on the support board 25 (protective tape 26), and is United with the semiconductor chips 11 to form a sealed body 19.

Here, it is preferable that a front surface 19A of the sealed, body 19 (sealing resin layer 17) (a front surface 17A of the sealing resin layer 17) is flattened by grinding (flattening step). By grinding the sealed body 19, the front surface 19A of the sealed body 19 is flattened. In this case, it is possible not only to simply flatten the front surface 19A but also control the sealing resin layer 17 covering the upper surfaces of the semiconductor chips 11 to a desired thickness.

Rewiring Step S13

Figure 18:
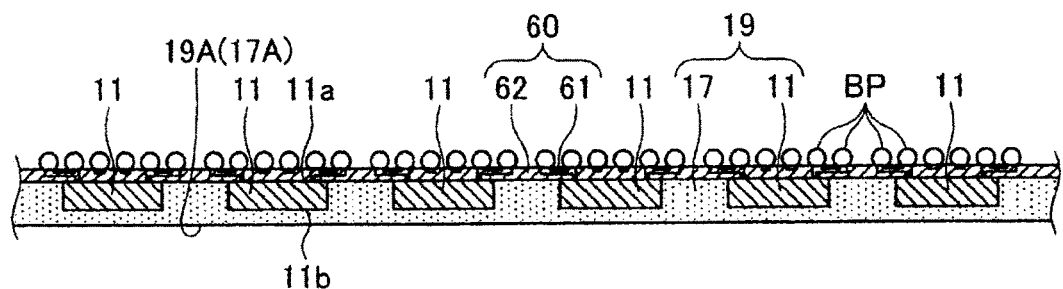
FIG. 18 is a sectional view illustrating a state wherein a rewiring layer and bumps are formed on a semiconductor chip side of a sealed body.

FIG. 18 is a side sectional view illustrating a state in which a rewiring layer and bumps are formed on the semiconductor chip side of the sealed body. In the case of forming the rewiring layer 60, the support board 25 and the protective tape 26 are peeled off from the front surface 11a side of the semiconductor chips 11 that forms the back surface of the sealed body 19, and the sealed body 19 is mounted on a jig (not illustrated), with the front surface 19A directed down. The jig has, for example, a suction mechanism, and holds the sealed body 19. This results in that the semiconductor chip 11 side of the sealed body 19 is exposed as an upper surface, as illustrated in FIG. 18.

The rewiring layer 60 and the bumps BP are formed on the semiconductor chip 11 side of the sealed body 19. The rewiring layer 60 includes a metal-made wiring 61 formed of aluminum or the like and connected to selected terminals (not illustrated) of the semiconductor chips 11, and an insulating film 62 covering the front surfaces 11a of the semiconductor chips 11 and the wiring 61. To form the rewiring layer 60, first, the wiring 61 is formed by a film forming method such as CVD or plating, and, next, the insulating film 62 is formed. As a material for the insulating film 62, there may be used an insulating resin such as polyimides, or a glass-based oxide film such as spin on glass (SOG) or boron phosphorous silicate glass (BPSG). In the case of the insulating resin or SOG, the insulating film 62 is formed by the above-mentioned spin coating method. In the case of BPSG, the insulating film 62 is formed by a film forming method such as CVD. The bumps BP are members which are to be terminals or electrodes when a semiconductor package as a final form is mounted to one of various substrates (not illustrated), and are formed in predetermined positions according to the pattern of the wiring 61 formed on the rewiring layer 60.

Individualizing Step S14

Figure 19:
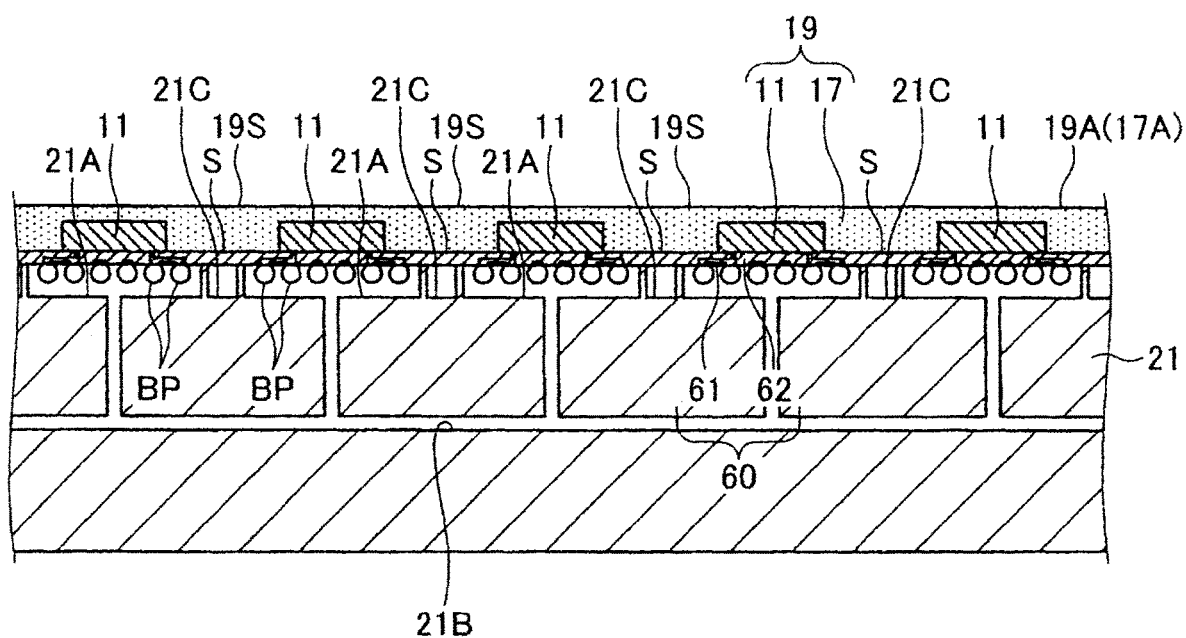
FIG. 19 is a sectional view of a sealed body provided with a rewiring layer.
Figure 20:
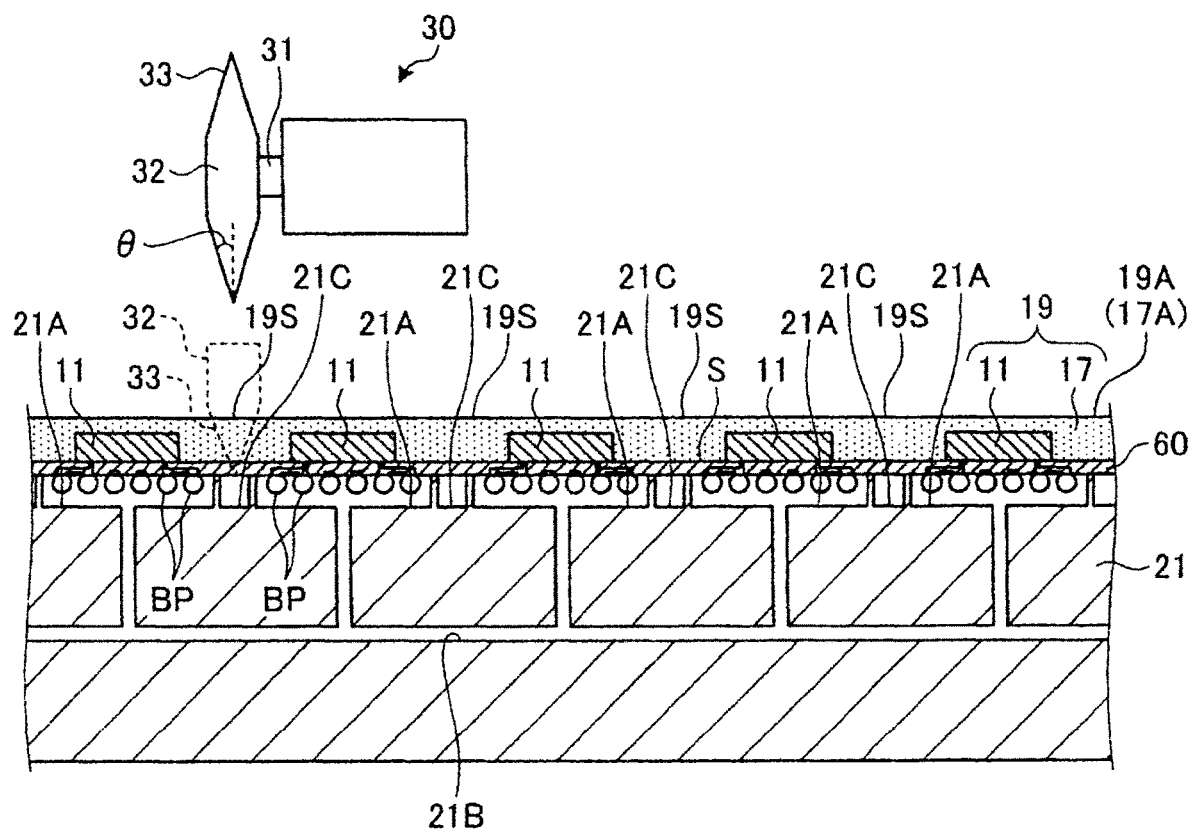
FIG. 20 is a sectional view illustrating an example of a configuration for individualizing a sealed body by cutting.
Figure 21:
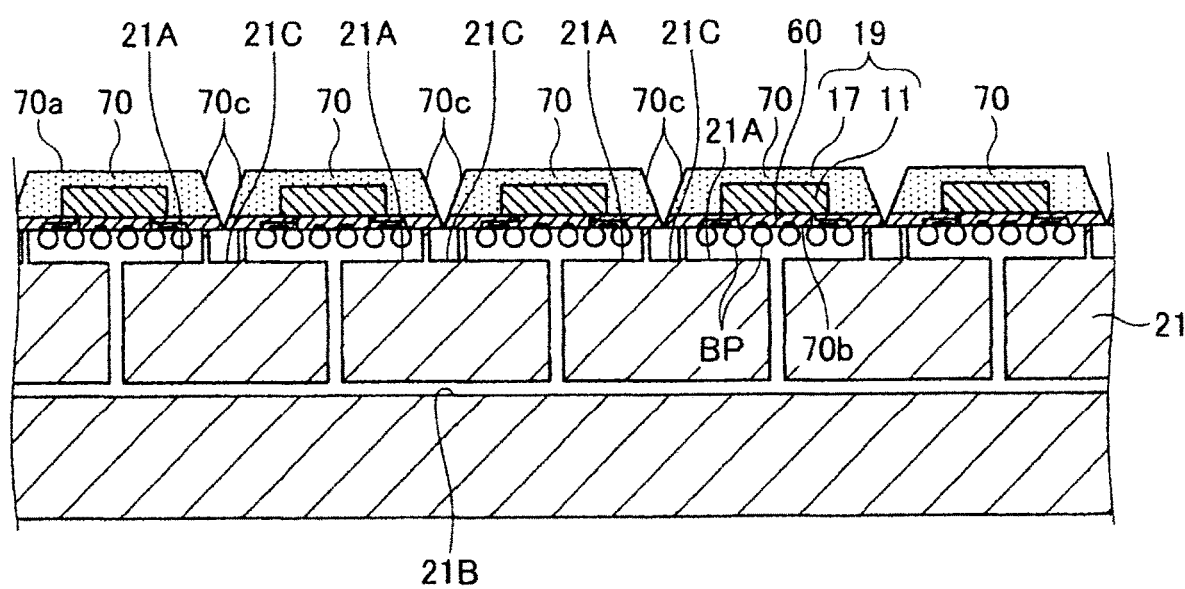
FIG. 21 is a sectional view illustrating sealed chips individualized by cutting.

FIG. 19 is a side sectional view illustrating a sealed body provided with a rewiring layer, FIG. 20 is a side sectional view illustrating an example of a configuration for individualizing a sealed body by cutting, and FIG. 21 is a side sectional view illustrating sealed chips individualized by cutting. The sealed bodies 19 are held on an individualizing jig 21, with the rewiring layers 60 as lower surfaces. The individualizing jig 21 is formed in its upper surface with a plurality of holes 21A in a matrix pattern, and bumps BP of the rewiring layer 60 and the bumps BP corresponding to each semiconductor chip 11 are accommodated in each of the holes 21A. In addition, each hole 21A is connected with a suction passage 21B communicating with a suction source (not illustrated), and the rewiring layer 60 and the sealed body 19 are held by suction. Besides, the individualizing jig 21 is formed with cutting grooves 21C between the holes 21A. The cutting grooves 21C are formed to correspond to the above-mentioned streets S when the rewiring layer 60 and the sealed body 19 are held by the individualizing jig 21.

Next, the sealed body 19 and the rewiring layer 60 are cut along regions 19S corresponding to the streets S. In this embodiment, as illustrated in FIG. 20, the cutting of the sealed body 19 is conducted using a cutting unit 30. The cutting unit 30 is provided with a cutting blade 32 mounted to a rotating spindle 31. The cutting blade 32 is formed in a circular disk shape, and is provided at its peripheral edge portion with a cutting edge 33 formed in an annular shape. As illustrated in FIG. 20, the cutting edge 33 is a V-shaped cutting edge having a predetermined cutting edge angle θ relative to a vertical line. In addition, the cutting unit 30 is moved in such a manner that the cutting blade 32 can be advanced and retracted in the height direction relative to the sealed body 19, by a lift mechanism which is not illustrated. Therefore, with the cutting blade 32 made to cut into the sealed body 19 and the rewiring layer 60 while rotating, the sealed body 19 and the rewiring layer 60 are cut at an inclination angle according to the cutting edge angle θ. Besides, since the individualizing jig 21 is formed with the cutting grooves 21C corresponding to the streets S, a cutting edge tip of the cutting edge 33 having cut the rewiring layer 60 comes into the cutting groove 21C, whereby interference between the individualizing jig 21 and the cutting blade 33 (cutting edge 33) can be prevented from occurring.

In addition, the sealed board IS held by the individualizing jig 21 is moved in a horizontal direction relative to the cutting unit 30 by a moving mechanism which is not illustrated. By this, the sealed body 19 and the rewiring layer 60 are cut along the regions 19S corresponding to all the streets S, thereby being individualized into a plurality of sealed chips 70, as illustrated in FIG. 21. The sealed chips 70 each include an upper surface 70a, a lower surface 70b larger than the upper surface 70a, and side surfaces (side walls) 70c each inclined from the upper surface 70a toward the lower surface 70b. Note that the above-mentioned lift mechanism and moving mechanism may have any configuration so long as the cutting unit 30 and the individualizing jig 21 can be thereby lifted and moved relative to each other.

Besides, as aforementioned, the individualization by cutting the sealed body 19 and the rewiring layer 60 can be performed by using a cutting unit (see FIG. 8) having a cutting blade inclined at a predetermined angle relative to a vertical line, or by using a laser beam application unit (see FIG. 9) which is disposed inclinedly at a predetermined angle in the direction orthogonal to the extending direction of the street (processing feed direction) in relation to a direction perpendicular to the surface (laser beam application surface) of the sealed body (vertical direction) and which emits a laser beam inclined at the predetermined angle. Further, though omitted in the drawing, a configuration may be adopted wherein the sealed body 19 and the rewiring layer 60 are perpendicularly (vertically) cut (diced) along the streets by use of the cutting unit or the laser beam application apparatus, and thereafter the side surfaces of the sealed chips thus separated are subjected to inclined-surface processing by a profiler or the like.

Shield Layer Forming Step S15

Figure 22:
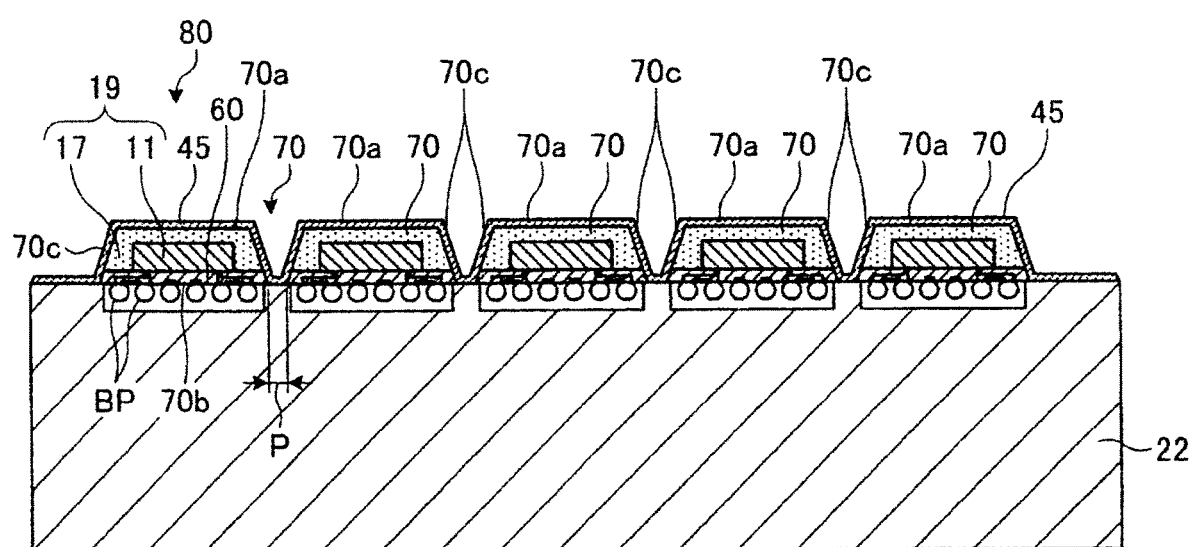
FIG. 22 is a sectional view illustrating sealed chips formed with a conductive shield layer.

FIG. 22 is a side sectional view illustrating sealed chips formed with a conductive shield layer. Before forming the conductive shield layer 45, the individualized sealed chips 70 are picked up from the individualizing jig 21 holding the sealed chips 70 thereon, and the sealed chips 70 are alignedly disposed on another jig 22 for covering. The covering jig 22 is formed in its upper surface with a plurality of holes 22A in a matrix pattern, like the individualizing jig 21, and the bumps BP of each of the sealed chips 70 are accommodated in each of the holes 22A. On the covering jig 22, the sealed chips 70 are disposed with a predetermined interval P between the adjacent sealed chips 70. The interval P has a distance which is sufficient for the conductive shield layer 45 to be formed to range to the lower ends of the side surfaces 70c of the sealed chips 70. Note that though omitted in FIG. 22, the covering jig 22 may be provided with a suction passage which communicates with each of the holes 22A for holding the sealed chips 70 by suction.

Next, the conductive shield layer 45 is formed on the upper surfaces 70a and side surfaces 70c of the sealed chips 70. The conductive shield layer 45 is a multilayer film formed of at least one metal selected from among copper, titanium, nickel, gold and the like in a thickness of approximately several micrometers to several hundreds of micrometers, by sputtering, CVD, or spray coating. In addition, the conductive shield layer 45 may be formed by vacuum lamination wherein a metallic film included of the above-mentioned multilayer film is adhered (laminated) onto the upper surfaces 70a and side surfaces 70c of the sealed chips 70 by use of a conductive adhesive in a vacuum atmosphere. In this embodiment, since the side surfaces 70c of the sealed chips 70 are inclined surfaces which are each inclined from the upper surface 70a toward the lower surface 70b, it is ensured that in the case of forming the conductive shield layer 45 by sputtering or the like from above the sealed chips 70, the metallic film can be easily formed not only on the upper surfaces 70a but also on the side surfaces 70c. Therefore, it is possible to make uniform the film thickness of the conductive shield layer 45 on the upper surfaces 70a and side surfaces 70c of the sealed chips 70.

Finally, the sealed chips 70 formed with the conductive shield layer 45, or semiconductor packages 80, are picked up from the covering jig 22 by a pick-up unit, and are carried to the subsequent step.

According to this embodiment, the method of manufacturing the semiconductor package includes: the chip disposing step S11 of disposing the semiconductor chips 11 in the device disposing regions A1 on the support board 25 partitioned by the plurality of crossing streets S, with the front surfaces 11a of the semiconductor chips 11 on the lower side; the sealed body forming step S12 of sealing the back surface 11b side of the semiconductor chips 11 with a liquid resin to form the sealed body 19 on the support board 25, after performing the chip disposing step S11; the rewiring step S13 of forming, the rewiring layer 60 and the bumps BP on the semiconductor chip 11 side of the sealed body 19, after removing the support board 25 from the sealed body 19; the individualizing step S14 of cutting the sealed body 19 along the regions 19S corresponding to the streets S on the sealed body 19, to perform individualization such that the sealed chips 70 each have the upper surface 70a and the lower surface 70b larger than the upper surface 70a, with the side surfaces 70c each inclined from the upper surface 70a toward the lower surface 70b; and the shield layer forming step S15 of forming the conductive shield layer 45 on the upper surfaces 70a and the side surfaces 70c of the plurality of sealed chips 70. Therefore, in the case of forming the conductive shield layer 45 by sputtering or the like from above the sealed chips 70, the metallic film can be easily formed on not only the upper surfaces 70a but also the side surfaces 70c. Accordingly, it is possible to make uniform the film thickness of the conductive shield layer 45 on the upper surfaces 70a and side surfaces 70c of the sealed chips 70.

In addition, in this embodiment, the individualizing step S14 includes individualization wherein the cutting blade 32 provided with the annular cutting edge 33 is made to cut into the sealed body 19 while rotating, so that the sealed body 19 can be easily individualized. In this case, by setting the cutting blade 32 to have the cutting edge 33 as a V-shaped cutting edge having a cutting edge angle $\theta$, or by disposing the cutting blade 32 to be inclined at a predetermined angle $\theta$ relative to a vertical line, it is possible, at the time of individualization, to easily form the side surfaces 70c of the sealed chips 70 as inclined surfaces each inclined from the upper surface 70a toward the lower surface 70b.

Besides, in the another example of this embodiment, the focusing unit of the laser beam application apparatus is disposed to be inclined at a predetermined angle $\theta$ in a direction orthogonal to the extending direction of the street S (processing feed direction) relative to a direction perpendicular to the front, surface 19A of the sealed body 19, so that, at the time of individualization by laser processing, the side surfaces 70c of the sealed chips 70 can be easily formed as inclined surfaces each inclined from the upper surface 70a toward the lower surface 70b.

In addition, while the semiconductor chips 11 are disposed in the device disposing regions A1 on the support board 25 with the front surface (one side) 11a of each semiconductor chip 11 (provided with the device) on the lower side in the chip disposing step S11 in this embodiment, this is not restrictive. The semiconductor chips 11 may be disposed in the device disposing regions A1 on the support board 25 with the back surface (the other side) 11b of each semiconductor chip 11 on the lower side. In this case, though omitted in the drawing, the device on the front surface (one side) 11a of each semiconductor chip 11 exposed on the support board 25 is preliminarily provided with an auxiliary rewiring layer including polyimide or silica, and the semiconductor chips 11 having the rewiring layer are sealed with a resin. Then, the front surface of the sealed body (the side of the front surfaces 11a of the semiconductor chips 11) is ground to such an extent that the devices are not exposed, and a rewiring layer communicating with the devices is formed on the front surface of the sealed body. Subsequently, the sealed body formed with the rewiring layer is subjected to the above-mentioned individualizing step and shield layer forming step, whereby the sealed chips can be formed.

Figure 23:
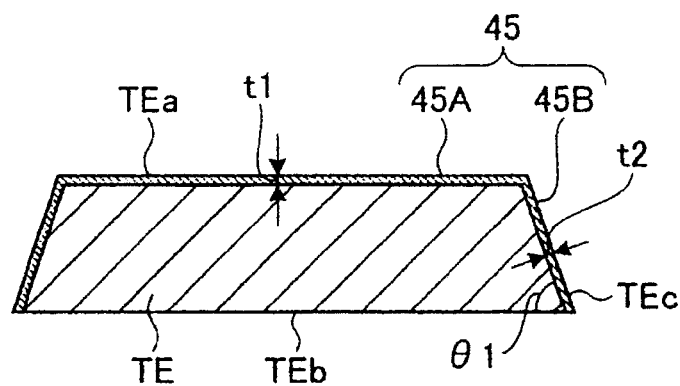
FIG. 23 is a view illustrating a film thickness of a conductive shield layer provided on a specimen.
Figure 24:
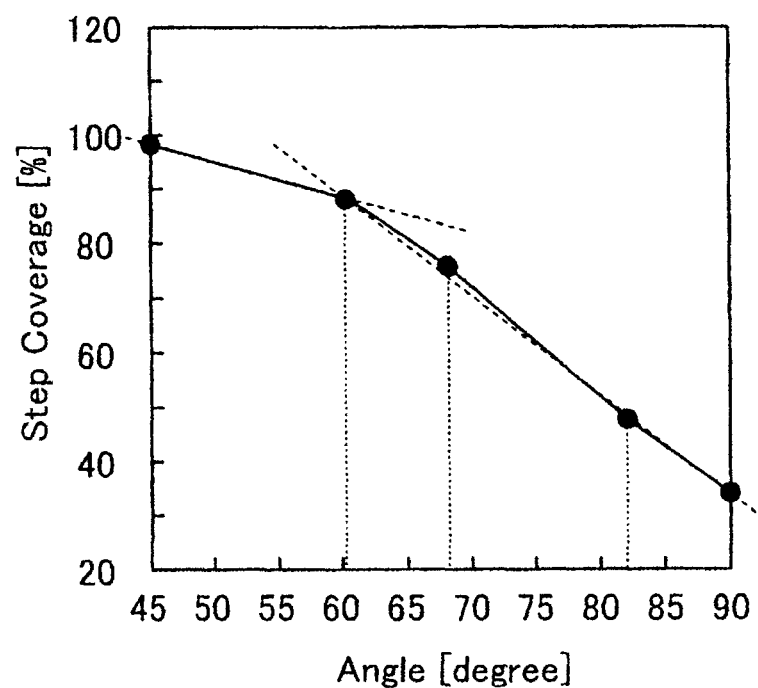
FIG. 24 is a view illustrating a relationship between inclination angle of a side surface of a specimen and film thickness.

Now, the relationship between the inclination angle of the side surfaces of the sealed chips in the above embodiment and the film thickness of the conductive shield layer formed on the side surfaces will be described. FIG. 23 is a view illustrating a film thickness of a conductive shield layer provided on a specimen, and FIG. 24 is a diagram illustrating the relationship between the inclination angle of the side surfaces of the specimen and the film thickness. The present inventor paid attention to the relationship between the inclination angle of the side surfaces 40c (70c) of the sealed chip 40 (70) and the film thickness of the conductive shield layer 45 formed on the side surfaces 40c (70c), and measured the film thickness of the respective conductive shield layers 45 for different inclination angles of the side surfaces 40c (70c).

Specifically, as illustrated in FIG. 23, a plurality of specimens TE which, formed of silicon, each have an upper surface TEa, a lower surface TEb, and side surfaces TEc and which are changed in inclination angle θ1 of the side surfaces TEc were formed, and a conductive shield layer 45 was formed on the upper surface TEa and the side surfaces TEc of each specimen TE. The conductive shield layer 45 was formed by an ion plating method using titanium metal under the conditions of 180° C. and $8 \times 10^{-4}$ Pa. In addition, the inclination angle θ1 was set to be 90 degrees, 82 degrees, 68 degrees, 60 degrees, and 45 degrees. Here, the inclination angle θ1 has the relation of the following formula (1) with the predetermined cutting edge angle θ relative to a vertical line:

$$\theta 1 \text{ (degrees)} = 90 - \theta \quad (1)$$

In addition, the conductive shield layer 45 was divided into an upper shield layer 45A formed on the upper surface TEa and a side shield layer 45B formed on the side surface TEc, and the thickness t1 of the upper shield layer 45A and the thickness t2 of the side shield layer 45B were measured based on images observed under a scanning electron microscope (SEM). From the thickness t1 of the upper shield layer 45A and the thickness t2 of the side shield layer 45B thus measured, a value of step coverage represented by the following formula (2) was calculated, and the relationship between the thus calculated value and the inclination angle θ1 was summarized in FIG. 24.

$$\text{Step coverage} = (t2/t1) \times 100 (\%) \quad (2)$$

As illustrated in FIG. 24, as the value of the inclination angle θ1 decreased from the state of 90 degrees (the state of the side surface being vertical), the value of step coverage gradually increased, to 100% at an inclination angle θ1 of 45 degrees. In other words, in the case of such a setting that the inclination angle θ1 is 45 degrees, the thickness t1 of the upper shield layer 45A and the thickness t2 of a lower portion of the side shield layer 45B coincide with each other, so that it is possible to make uniform the film thickness of the conductive shield layer 45 on the upper surface TEa and the side surface TEc.

According to the present inventor's experiments, in the case of forming the conductive shield layer 45 by the above-mentioned ion plating method, a step coverage value of below 50% results in that it takes long time to form the side shield layer 45B, leading to an increased process cost; therefore, it is preferable that the step coverage value is at least 50%. For this reason, it is preferable that the inclination angle θ1 of the side surfaces 40c (70c) of the sealed chip 40 (70) constituting the semiconductor package 50 (30) is in the range of equal to or not less than 45 to equal to or not more than 82 degrees.

Although an excellent step coverage value is indicated in the case where the inclination angle θ1 is 45 degrees, the Inclination angle θ1 of 45 degrees is accompanied by a problem in that the length of the lower surface TEb relative to the upper surface TEa increases With the result of an increase in the size of the semiconductor package 50 (80), or that keeping the size of the lower surface TEb at a conventional size leads to a reduction in the size of the upper surface TEa (device region). Therefore, from the viewpoint of making the semiconductor package 50 (80) smaller in size, the Inclination angle θ1 is more preferably in the range of equal to or not less than 60 to equal to or not more than 68 degrees, and, in the most preferable condition, the inclination angle θ1 is 60 degrees. On the other hand, the variation rate of the step coverage value in an inclination angle (θ1) range of equal to or not less than 45 to equal to or not more than 60 degrees is smaller than that in an inclination angle (θ1) range of equal to or not less 60 to equal to or not more than 82 degrees. Therefore, for example, even in the case where the inclination angle of the cutting edge 33 is varied during processing, a variation in the film thickness of the shield layer formed can be suppressed. For this reason, in the case where a robust effect in the case of mass production or the like is desired, it is preferable to set the inclination angle θ1 to within the range of equal to or not less than 45 to equal to or not more than 60 degrees. If such a range of small step coverage variation rate can be shifted into a region of larger inclination angle θ1, it is possible to realize both a smaller size and a higher productivity in regard of the semiconductor package 50 (80), which is desirable.

While some embodiments of the present invention have been described above, the above embodiments are merely illustrative examples and are not intended to limit the scope of the invention. While each of the steps has been carried out by holding the wiring board 10 on each jig in the first embodiment described above, this configuration is not restrictive. For example, a protective tape (not illustrated) may be adhered to the back surface (the other side) 10b of the wiring board 10, and each of the steps may be carried out in a state in which the wiring board 10 is placed on a base (not illustrated) through the protective tape. The base may have, for example, a suction mechanism or a moving mechanism or mechanisms for moving in a horizontal direction and the vertical direction, and the wiring board may thereby be held in such a manner as to be movable. In addition, while a case where the semiconductor package to be formed is a BGA with bumps formed on the back surface of a wiring board has been primarily described in the first embodiment above, this is not restrictive. For example, a land grid array (LGA) with lands formed on the back surface of a wiring board and a Quad Flat No lead package (QFN) can naturally be formed as the semiconductor package by the manufacturing method of the present invention. Besides, while an example wherein the semiconductor chips 11 are disposed in the device disposing regions A1 on the support board 25 with the front surface (one side) 11a of each semiconductor chip 11 on the lower side has been described in the second embodiment above while assuming so-called flip-chip mounting of the semiconductor chip 11, the semiconductor chips 11 are disposed in the device disposing regions A1 on the support board 25 with the back surface (the other side) 11b of each semiconductor chip 11 on the lower side in the case of wire bond mounting of the semiconductor chip 11. In addition, for example, in the case where the semiconductor apparatus is a CSP, division of a wafer W (silicon substrate) may be conducted in such a manner as to provide inclined surfaces correspondingly to the devices formed on the wafer W, and a shield layer may be formed ranging to a ground.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a semiconductor package, the method comprising:
   a chip disposing step of disposing a semiconductor chip in each of device disposing regions on a support board partitioned by a plurality of crossing division lines;
   a sealed body forming step of sealing the semiconductor chips with a sealant to form a sealed body on the support board, after performing the chip disposing step, thereby forming sealed semiconductor chips;
   a rewiring step of forming a rewiring layer and bumps on a side where the semiconductor chip is disposed, after the support board is removed from the sealed body;
   an individualizing step of cutting the sealed body along regions corresponding to the division lines on the support board, to perform individualization in such a manner that the sealed semiconductor chips each have an upper surface and a lower surface larger than the upper surface, with a side wall inclined from the upper surface toward the lower surface; and
   a shield layer forming step of forming a conductive shield layer on the upper surfaces and the side walls of the plurality of sealed semiconductor chips wherein the shield layer forming step is performed after the individualizing step.

2. The method of manufacturing the semiconductor package according to claim 1,
   wherein, in the individualizing step, a cutting blade having an annular cutting edge is made to cut into the sealed body while rotating, thereby to perform individualization.

3. The method of manufacturing the semiconductor package according to claim 1,
   wherein, in the individualizing step, a laser beam is applied to the sealed body while inclining the laser beam at a predetermined angle in a direction orthogonal to a processing feed direction in relation to a direction perpendicular to a laser beam application surface of the sealed body, thereby to perform individualization.

4. The method of manufacturing the semiconductor package according to claim 1, wherein:
   the rewiring step is performed with the sealant facing downwards; and
   the individualizing step is performed with the sealant facing upwards.

5. The method of manufacturing the semiconductor package according to claim 1, wherein:
   the rewiring step is performed with the sealant facing towards a first direction; and
   the individualizing step is performed with the sealant facing towards a second direction, where the second direction is opposite of the first direction.

6. The method of manufacturing the semiconductor package according to claim 1, further comprising:
   a step of positioning the sealed body on an individualizing jig, prior to performing the individualizing step, such that the rewiring layers and bumps formed during the rewiring step are facing the individualizing jig.

* * * * *